United States Patent
Nemati Anaraki et al.

(10) Patent No.: US 9,270,296 B1
(45) Date of Patent: Feb. 23, 2016

(54) METHOD AND SYSTEM FOR SOFT DECODING THROUGH SINGLE READ

(71) Applicant: Western Digital Technologies, Inc., Irvine, CA (US)

(72) Inventors: Majid Nemati Anaraki, Irvine, CA (US); Aldo G. Cometti, San Diego, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 114 days.

(21) Appl. No.: 14/100,435

(22) Filed: Dec. 9, 2013

Related U.S. Application Data

(60) Provisional application No. 61/903,901, filed on Nov. 13, 2013.

(51) Int. Cl.
| | | |
|---|---|---|
| *G11C 29/00* | (2006.01) | |
| *H03M 13/11* | (2006.01) | |
| *G06F 11/10* | (2006.01) | |

(52) U.S. Cl.
CPC ....... *H03M 13/1105* (2013.01); *G06F 11/1008* (2013.01)

(58) Field of Classification Search
None
See application file for complete search history.

(56) References Cited

U.S. PATENT DOCUMENTS

| | | | |
|---|---|---|---|
| 5,299,162 A | 3/1994 | Kim et al. | |
| 6,405,342 B1 * | 6/2002 | Lee | 714/792 |
| 6,604,220 B1 * | 8/2003 | Lee | 714/769 |
| 6,856,556 B1 | 2/2005 | Hajeck | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,558,109 B2 | 7/2009 | Brandman et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,805,663 B2 | 9/2010 | Brandman et al. | |
| 7,898,855 B2 | 3/2011 | Merry, Jr. et al. | |
| 7,904,793 B2 | 3/2011 | Mokhlesi et al. | |

(Continued)

OTHER PUBLICATIONS

Jonghong Kim, et al., "Low-energy error correction of NAND flash memory through soft-decision decoding," EURASIP Journal on advances in Signal Processing, 2012:195, pp. 1-12.

(Continued)

*Primary Examiner* — Daniel McMahon
(74) *Attorney, Agent, or Firm* — McDermott Will & Emery LLP

(57) ABSTRACT

Systems and methods are disclosed for decoding solid-state memory cells using one-read soft decision decoding. A controller of a data storage device is configured to perform a first decoding of a first code word based at least in part on data associated with a reading of the first code word, and to detect a decoding failure associated with the first decoding. The controller determines reliability information for decoding the first code word in response to the decoding failure based at least in part on data associated with a successful decoding of a second code word and performs a second decoding of the first code word based at least in part on the reliability information.

22 Claims, 9 Drawing Sheets

(56) References Cited

U.S. PATENT DOCUMENTS

| | | |
|---|---|---|
| 7,911,836 B2 | 3/2011 | Zilberman |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,132,045 B2 | 3/2012 | Avila et al. |
| 8,135,903 B1 | 3/2012 | Kan |
| 8,151,020 B2 | 4/2012 | Merry, Jr. et al. |
| 8,156,398 B2 | 4/2012 | Sommer |
| 8,156,403 B2 | 4/2012 | Shalvi et al. |
| 8,161,227 B1 | 4/2012 | Diggs et al. |
| 8,166,245 B2 | 4/2012 | Diggs et al. |
| 8,243,514 B2 | 8/2012 | Kang et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,495,465 B1 * | 7/2013 | Anholt et al. .................. 714/763 |
| 8,503,237 B1 | 8/2013 | Horn |
| 8,521,972 B1 | 8/2013 | Boyle et al. |
| 8,547,743 B2 | 10/2013 | Ulriksson et al. |
| 8,549,236 B2 | 10/2013 | Diggs et al. |
| 8,549,382 B2 | 10/2013 | Motwani |
| 8,560,901 B2 | 10/2013 | Seol et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 8,843,812 B1 * | 9/2014 | Tang et al. .................. 714/795 |
| 8,924,824 B1 * | 12/2014 | Lu .................. G06F 11/1048 365/185.2 |
| 8,935,600 B1 * | 1/2015 | Varnica et al. .................. 714/794 |
| 9,007,854 B1 * | 4/2015 | Nemati Anaraki et al. .................. 365/189.15 |
| 2008/0294959 A1 * | 11/2008 | Chindapol et al. .................. 714/752 |
| 2010/0174849 A1 | 7/2010 | Walston et al. |
| 2010/0250793 A1 | 9/2010 | Syu |
| 2011/0099323 A1 | 4/2011 | Syu |
| 2011/0185251 A1 * | 7/2011 | d'Abreu et al. .................. 714/752 |
| 2011/0191652 A1 | 8/2011 | Dave et al. |
| 2011/0283049 A1 | 11/2011 | Kang et al. |
| 2012/0063227 A1 | 3/2012 | Weingarten et al. |
| 2012/0236638 A1 | 9/2012 | Weingarten et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0124940 A1 * | 5/2013 | Yang .................. 714/755 |
| 2013/0132638 A1 | 5/2013 | Horn et al. |
| 2013/0145106 A1 | 6/2013 | Kan |
| 2013/0163328 A1 | 6/2013 | Karakulak et al. |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2015/0100854 A1 * | 4/2015 | Lu .................. 714/773 |

OTHER PUBLICATIONS

Jiadong Wang, et al., "Soft Information for LDPC Decoding in Flash: Mutual-Information Optimized Quantization," In Proc. Of IEEE Global Telecommunications Conference (GLOBECOM), Dec. 2011, pp. 1-6.

* cited by examiner

| L-PAGE # | | | | E-PAGES NEEDED |
|---|---|---|---|---|
| L-Page 1 = | E-Page 1003 | Offset 800 | Len 1624 | 1003, 1004 |
| L-Page 2 = | E-Page 1004 | Offset 400 | Len 696 | 1004 |
| L-Page 3 = | E-Page 1004 | Offset 1120 | Len 4096 | 1004, 1005, 1006 |
| L-Page 4 = | E-Page 1006 | Offset 1144 | Len 3128 | 1006, 1007, 1008 |

METHOD AND SYSTEM FOR SOFT DECODING THROUGH SINGLE READ

RELATED APPLICATION

This application claims the benefit of priority under 35 U.S.C. §119(e) of U.S. Provisional Application No. 61/903,901, filed on Nov. 13, 2013, and entitled "One-Read Soft Decoding," the disclosure of which is hereby incorporated by reference in its entirety.

BACKGROUND

1. Field

This disclosure relates to data storage systems. More particularly, the disclosure relates to systems and methods for decoding solid-state memory cells.

2. Description of Related Art

Certain solid-state memory devices, such as flash drives, store information in an array of memory cells constructed with floating gate transistors. Decoding such memory cells may involve reading the charge levels of the cells using one or more voltage threshold levels.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
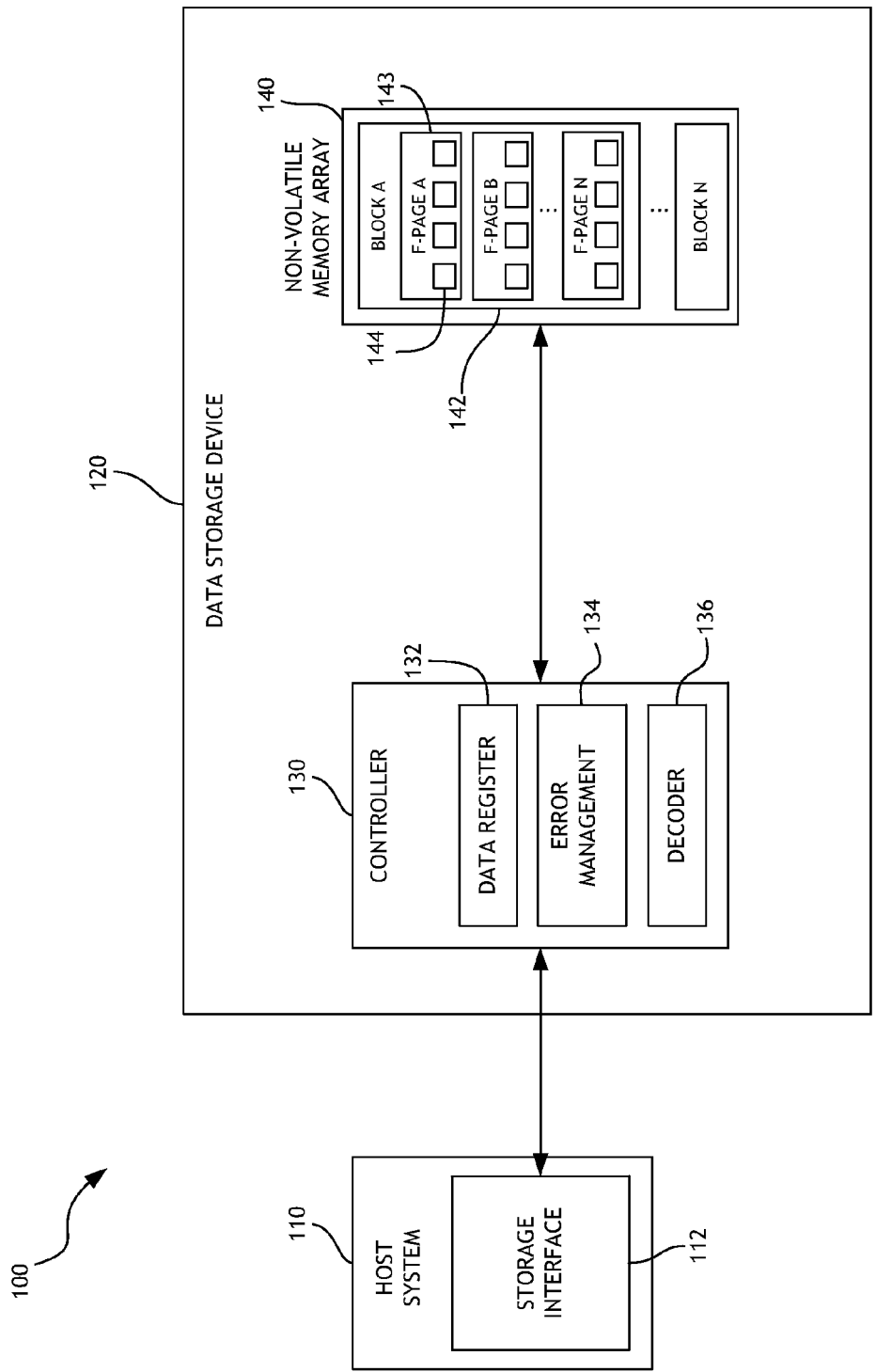
FIG. 1 is a block diagram of a data storage system according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

In solid-state memory systems, reading data from the memory array can present a relatively substantial time cost compared to certain other error management operations. When error correction fails on data after a first read, various methods may be implemented to recover the data. However, some such methods may require one or more additional reads from the memory array, which can result in extra read time that can affect system performance and throughput negatively.

Certain embodiments disclosed herein provide for data decoding using a one-read soft-decision decoding scheme, wherein existing data from a first read (e.g., related to one or more other segments, or code words, of the memory page being read) is used to provide reliability information associated with the data of the failed read. Such embodiments may allow for recovery of previously uncorrectable code words without requiring additional reads of the memory array, which can substantially improve the overall performance of the system or equivalently postpone performance degradation when the memory array ages.

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "target page," or variations thereof are used herein according to their broad and ordinary meaning. For example, "page" may refer to a block of a physical memory cells, or to the physical memory cells themselves. Furthermore, within a multi-level cell (MLC), "page" may refer to either of upper or lower pages, which may in tern be associated with most significant bits (MSB), least significant bits (LSB), or other programming mechanism or scheme.

The terms "code word," "E-page," and "block" may be used herein to refer to a block, segment, or other partition of memory, or memory cells, comprising a plurality of bits of data. While, certain embodiments make reference to E-pages, the size, configuration, and/or use of such units of memory may or may not be correlated with error correction, or blocks to which error correction code has been applied.

Data Storage System

FIG. 1 is a block diagram illustrating an embodiment of a combination of a host system 110 with a data storage device 120 incorporating error management functionality in accordance with embodiments disclosed herein. As shown, the data storage device 120 (e.g., hybrid hard drive, solid-state drive, any storage device utilizing solid-state memory, etc.) includes a controller 130 configured to receive data commands to execute such commands in the non-volatile memory array 140. Such commands may include data read/write commands, and the like. The controller 130 may be configured to receive data commands from a storage interface (e.g., a device driver) 112 residing on the host system 110. Data commands may specify a block address in the data storage device 120; data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 140 and/or other memory module(s). Mapping data indicating the mapping of logical addresses to physical memory addresses may be maintained in the data storage device. For example, mapping table data may be stored in non-volatile memory array 140 in order to allow for recreation of mapping tables following a power cycle.

In certain embodiments, the non-volatile memory array 140 comprises one or more blocks of storage, identified as Block "A" 142 through Block "N." Each block may comprise a plurality of flash pages (F-pages). For example, Block A 142 of FIG. 1 includes a plurality of F-pages, identified as F-pages A 133, B, through N. In some embodiments, each F-page is a smallest grouping of memory cells in the non-volatile memory array 140 that can be programmed in a single operation or as a unit. Further, each F-page may include a plurality of code words, such as error-correcting pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages. The structure and configuration of the memory array 140 according to some embodiments is described in greater detail below in connection with FIGS. 4A-C.

The controller 130 includes an error management module 134 configured to manage errors associated with data reads from the non-volatile memory array 140. For example, the error management module may operate in connection with a decoder engine 136 to read and interpret data stored on the non-volatile memory array. The controller 130 may be configured to perform error correction according to any desirable method or combination of methods, such as forward-error correction (FEC) methods, including Bose-Chaudhuri-Hocquenghem (BCH) and Reed-Solomon (RS), which may utilize primarily hard-decision input providing a single bit of information, for example. Alternatively, the controller may utilize low-density parity-check (LCPC) decoding, which can utilize soft-decision input, wherein reads of data from the non-volatile memory array 140 include multiple-bit reliability information.

The controller 130 may include a data register 132 that is configured to store information related to the non-volatile memory array 140. For example, the data register may receive from the decoder 136 and/or error management 134 modules information related to flipped-bit counts of successfully decoded data read from the non-volatile memory array 140.

In certain embodiments, the non-volatile memory array 140 is a solid-state memory array (e.g., flash memory), wherein memory cells store charge in transistor devices, such as floating-gate transistors. The cells of the memory array 140 may be programmed according to a single-level cell (SLC), multi-level cell (MLC), or other programming scheme. Certain embodiments are described herein in the context of an MLC programming scheme, in which a single cell is configured to store two-bits of data.

Figure 2:
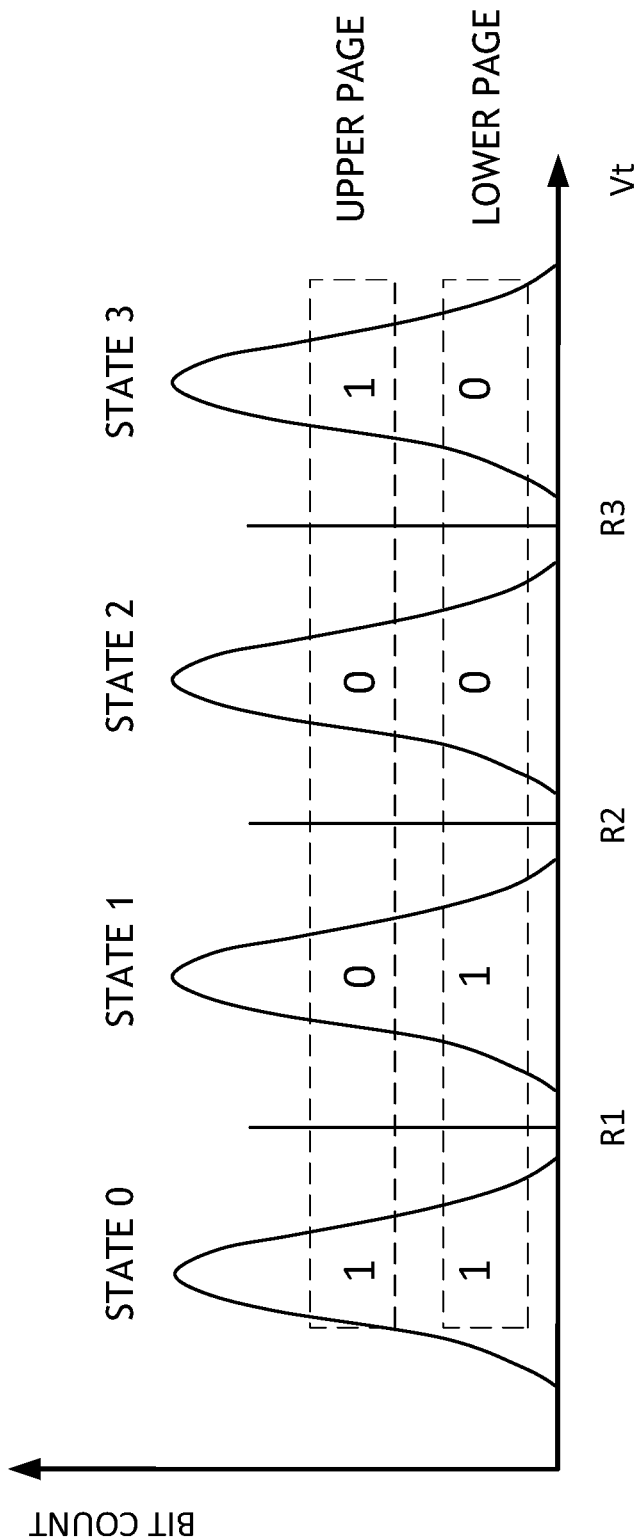
FIG. 2 is a graph showing a probability distribution of cells in a solid-state memory device according to an embodiment.

FIG. 2 is a graph showing a probability distribution of cells in an (MLC) solid-state memory array according to an embodiment. In two-bit MLC solid-state memory, memory cells may be programmed to one of four voltage states. For example, a first state (e.g., an erase state) may correspond to a two-bit value of "11." Higher voltage states may correspond to values of "01," "00," and "10," respectively, for example. As described herein, a most significant bit (MSB) of a two-bit programming state may represent an "upper page" of data, while a least significant bit (LSB) may represent a "lower page," or vice versa.

Generally speaking, certain solid-state memory may provide hard-decision data output based on a reading of the voltage stored in memory cells. For example, the three sensing reference voltages (R1, R2, and R3) may be utilized to fully resolve the four voltage state distribution shown. For example, R1 may be utilized to resolve the boundary between symbols '11' and '01'; while R2 resolves the boundary of symbols '01' and '00' and R3 resolves the boundary for symbols '00' and '10.' In certain embodiments, R1 and R3 are required to read upper pages, while only R2 is required for lower pages.

The gap between voltage distribution states, in which the read voltage references may advantageously be positioned in certain embodiments, is referred to as the "read margin." Over time, and as a result of various physical conditions and wear, for example from being subjected to repeated P/E cycles, the read margins between distribution levels may be reduced, resulting in endurance and/or data retention issues. Such reduction in read margin may be due to a number of factors, such as loss of charge due to flash cell oxide degradation, over-programming caused by erratic program steps, programming of adjacent erased cells due to heavy reads or writes in the locality of the cell (or write disturbs), and/or other factors.

Figure 3A:
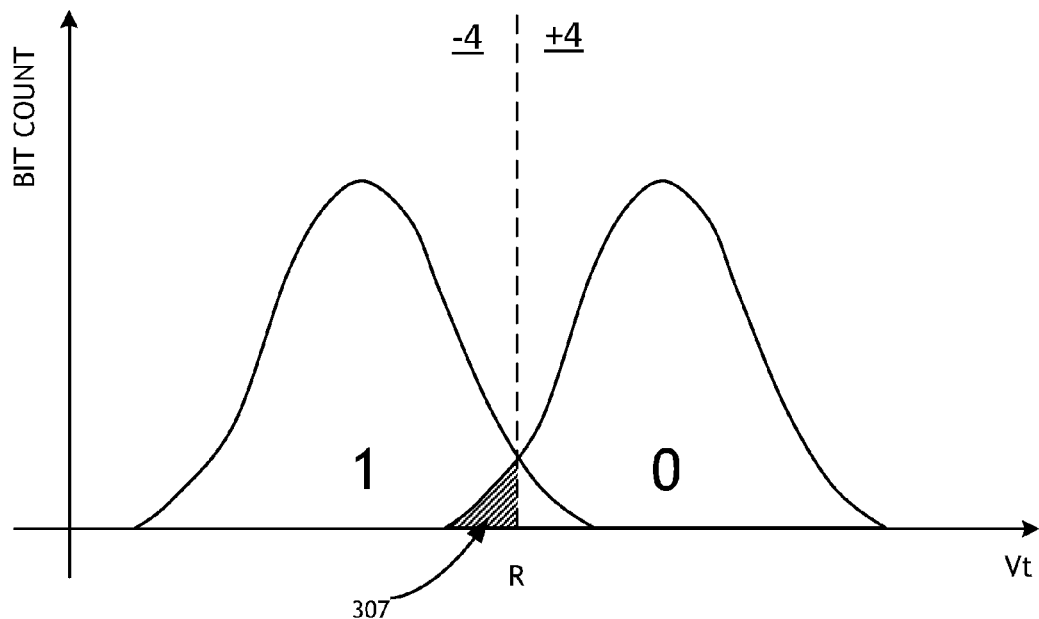
FIGS. 3A and 3B illustrate probability distributions for memory cells in a solid-state memory device according to an embodiment.

FIG. 3A illustrates an example voltage distribution including overlapping distribution states, which may be a result of endurance and/or data retention issues, as described above. While the diagram of FIG. 3A illustrates a two-state distribution, such distribution is provided for the purpose of simplification of description, and embodiments and features disclosed may be applicable to other types of coding schemes, such as MLC programming, as illustrated in FIG. 2. As shown in FIG. 3A, a single read may return incorrect information related to certain memory cells that have migrated across the reference voltage point R due to endurance and/or data retention issues. For example, when reading cells of the '0' state distribution that have migrated to the left of the reference level R, represented by the region 307, such read may incorrectly return a value of '1' for the cell(s). Furthermore, in hard-decoding, fixed reliability information may be associated with cell reads. Therefore, additional reliability information may be unavailable which would indicate that the cells in region 307 are in error.

Since certain solid-state memory devices may not provide multi-read precision, in order to provide desirable input to a decoder, such as an LDPC decoder, one-bit, hard-decision values may be transposed to, or associated with, multi-bit values. However, in certain embodiments, such multi-bit transposed value may contain substantially the same information as the single-bit value. In certain embodiments, a fixed multi-bit value is associated with cells on either side of a reference voltage level, such as +4 or −4, as shown. However, the values of +4/−4 may not provide any additional information that may not be captured in a single bit. Generating the transposed soft-decision values may allow for soft-decision input to be simulated using hard-decision information. Although +4 and −4 are illustrated, any desirable or suitable values may be used, depending on the relevant decoding engine.

Figure 3B:
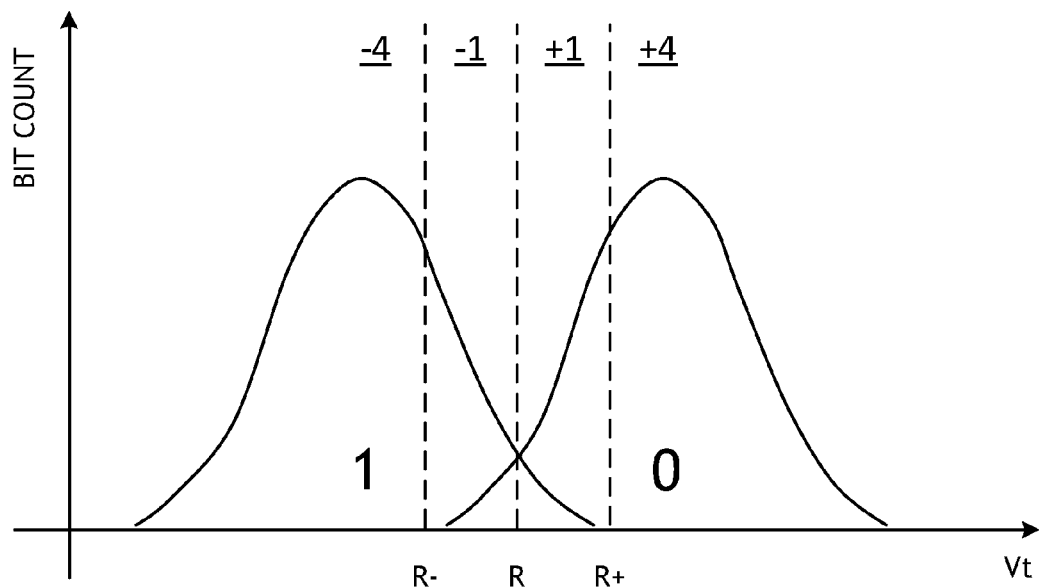

Certain soft-decision solutions provide for additional data based on multiple hard-decision reads at additional reference voltage levels. In particular, additional reads may be performed to increase resolution at or near overlapping regions, where a significant portion of bit errors may occur, as shown in FIG. 3B. The distribution of FIG. 3B shows two additional reads (R−, R+) located on opposite sides of the reference voltage level R. Certain multi-read solutions assign a region at a symbol boundary of the voltage distribution as an erasure region. For example, the region between R− and R+ may correspond to the erasure region. Alternatively, three voltage read levels may provide four different regions, e.g., below R−, between R− and R, between R and R+, and above R+. In certain embodiments, the lowest voltage region can be considered a strong '1' symbol, and the next lowest region is a value between '1' and '0.' Reliability incorporated in the multi-bit soft-decision value may reflect the strength of the read. For example, a strong '1' may be assigned a value of −4, whereas a weaker '1' may be assigned a value of −1. Further, a strong '0' may be assigned a value of +4, whereas a weaker '0' may be assigned a value of +1. Although −4, −1, +1 and +4 are described in the present embodiment, any suitable or desirable values may be utilized to reflect reliability information. Increasing the number of reads at each symbol boundary can provide more accurate reliability information. However, additional reads can also increase the latency and energy consumption in the memory.

One-Read Soft-Decision

Certain embodiments disclosed herein provide one-read soft-decision output based at least in part on existing data from the current read, such as data from one or more adjacent passing code words, or E-pages, located in the current F-page. Such utilization of available data may allow for recovery of data from previously un-correctable code words, or pages.

Figure 4A:
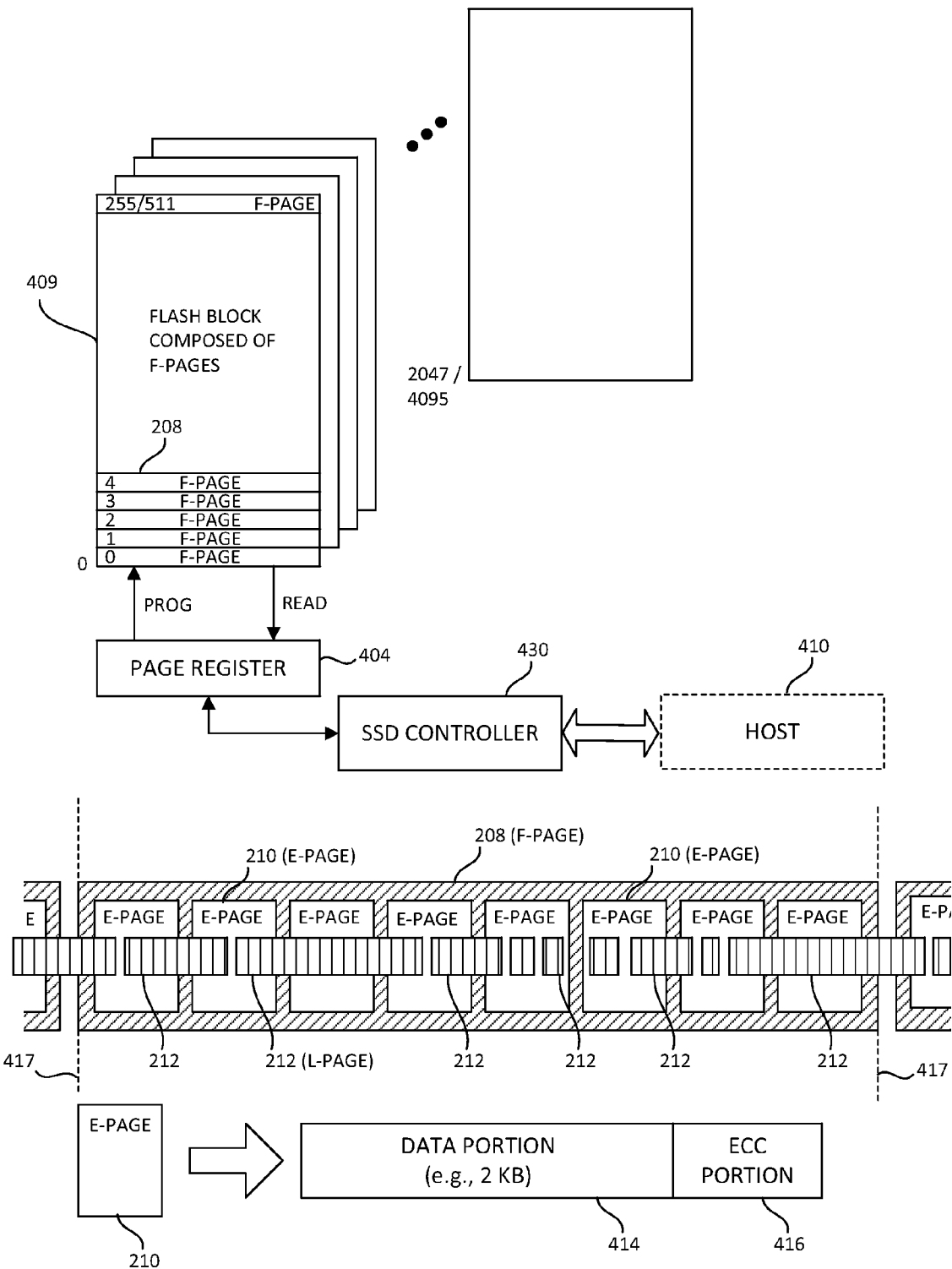
FIG. 4A is a diagram showing aspects of the physical and logical data organization of a data storage device according to one embodiment.

FIG. 4A is a diagram showing aspects of the physical and logical data organization of a data storage device illustrating the relationship between, among other things, E-pages (or code words) and pages of solid-state memory cells (F-pages). In one embodiment, relevant data storage device is a solid-state drive (SSD). A controller 430 according to one embodiment may be configured to be coupled to a host system 410. For example, the controller 430 may correspond to the controller 130 described above with respect to FIG. 1. The host 410 may utilize a logical block addressing (LBA) scheme. While the LBA size is normally fixed, the host can vary the size of the LBA dynamically. For example, the LBA size may vary by interface and interface mode. For example, the LBA size may be 512 Bytes, 4 KB, 512+(520, 528, etc.) or 4K+ (4K+8, 4K+16, etc.) formats.

The controller 430 may comprise or be coupled to one or more page registers 404. The controller 430 may be configured to program and read data from an array of flash memory devices responsive to data access commands from the host 418. While the description herein refers to flash memory, it is understood that the array of memory devices may comprise other types of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The page register 404 may be configured to enable the controller 430 to read data from and store data to the array. The array of flash memory devices may comprise a plurality of flash memory devices in one or more die. The flash memory devices may comprise a plurality of flash blocks 409, wherein a combination of flash blocks, grouped together, may be referred to as a Superblock or S-Block. An S-Block may comprise a plurality of flash blocks, spread across one or more die, that are combined together. In this manner, the S-Block may form a unit on which the Flash Management System (FMS) operates. In some embodiments, the individual blocks that form an S-Block may be chosen according to a different granularity than at the die level, such as the case when the memory devices include dies that are sub-divided into structures such as planes (i.e., blocks may be taken from individual planes). According to one embodiment, allocation, erasure and garbage collection may be carried out at the S-Block level. In other embodiments, the FMS may perform data operations according to other logical groupings such as pages, blocks, planes, dies, etc.

Each of the flash blocks 409 may comprise a plurality of physical pages such as flash pages (F-Pages) 208. Each F-Page 208 may be of a fixed size such as, for example, 16 KB. The size of the F-Pages 208, according to one embodiment, may be defined as the size of the minimum unit of program for a given flash device. As also shown in FIG. 4A, each F-Page 208 may be configured to accommodate one or more physical sub-pages, such as ECC pages, hereinafter denoted as E-Pages 210. As used herein, the term "E-Page" refers to a data structure configured to store data, in non-volatile memory, over which an error correcting code has been applied. According to one embodiment, E-Pages 210 may form the basis for physical addressing within the SSD and may constitute the minimum unit of flash read data transfer. That is, each E-Page 210 may be configured to store the minimum amount of data readable by the controller 430. The E-Page 210 may be of a predetermined fixed size (such as 2 KB, for example) and determine the size of the payload (e.g., host or other data) of the ECC system. The size of the physical pages (e.g., E-Pages), however, need not be fixed. In one embodiment, the address of an E-Page uniquely identifies the location of the E-Page within the flash memory. For example, the E-Page's address may specify the flash channel, a particular die within the identified flash channel, a particular block within the die, a particular F-Page and, finally, the start of the E-Page within the identified F-Page. Although described herein as E-Pages, such units of memory may correspond to other types of code word units, as relevant in a particular embodiment or implementation.

According to one embodiment, each F-Page 208 may be configured to fit one or more E-Pages 210 within its boundaries. For example, given 16 KB wide F-Pages 208 and a fixed size of 2 KB per E-Page 210, eight E-Pages 210 fit within a single F-Page 208, as shown in FIG. 4A. In any event, according to one embodiment, an integer number of E-Pages, such as a power of 2 multiple of E-Pages 210, including ECC, may be configured to fit into an F-Page 208. As also shown in FIG.

4A, each E-Page 210 may comprise a data portion 414 and, depending on where the E-Page 210 is located, may also comprise an ECC portion 416. The ECC portion 416 may be configured to store the ECC that was applied to the data stored in the data portion 414 of the E-Page 210. According to one embodiment, neither the data portion 414 nor the ECC portion 416 needs to be fixed in size. Therefore, according to one embodiment, for a given E-Page size, the ratio between the size of the ECC portion and the size of the data portion within an E-Page may be varied.

Figure 4B:
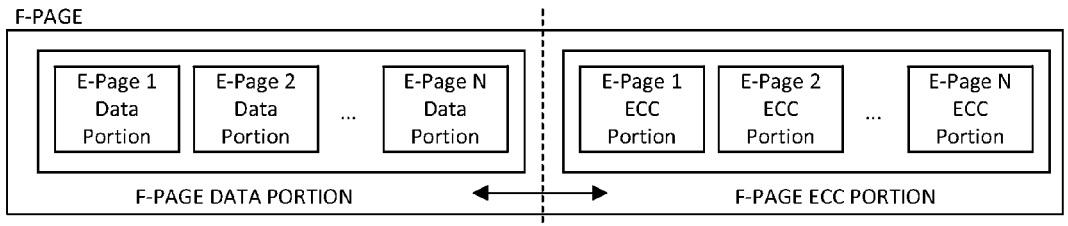
FIGS. 4B and 4C provide block diagrams representing pages in a solid-state memory array according to one embodiment.
Figure 4C:
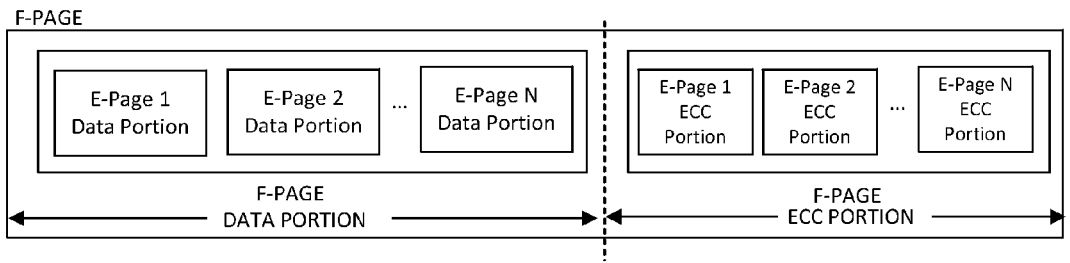

The E-Pages, data portions, and ECC portions need not be arranged according to the example arrangement of FIG. 4A. For example, the data portion and ECC portion of each E-Page may be physically separated, so that the data portions are grouped together and the ECC portions are grouped together within an F-Page, as shown in FIG. 4B. Within F-Pages, the data portions and the ECC portions may be variably-sized. Indeed, FIG. 4C shows an F-Page whose constituent data portions are relatively larger than the data portions of the E-Pages shown in FIG. 4B. Correspondingly, the ECC portions of the F-Page of FIG. 4C are relatively smaller in size than the ECC portions of the E-Pages shown in FIG. 4B. It follows, therefore, that in the aggregate within an F-Page, the F-Page data portion of the F-Page of FIG. 4C is larger than the F-Page data portion of the F-Page shown in FIG. 4B. Similarly, in the aggregate within an F-Page, the F-Page ECC portion of the F-Page of FIG. 4C is smaller in size, as compared to the F-Page data portion of the F-Page shown in FIG. 4B. Other arrangements of E-Pages, data portions, and ECC portions are possible in various embodiments, and the size adjustment methods disclosed herein are applicable to those embodiments as well. In one embodiment, an F-Page may include just one E-Page.

A logical page (L-Page) construct may be used to bridge between physical addressing on the SSD and logical block addressing by the host. An L-Page, denoted by the reference numeral 212 in FIGS. 4A and 4D, may comprise the minimum unit of address translation used by the flash management system. Each L-Page 212, according to one embodiment, may be associated with an L-Page number. In one embodiment, data is logically stored in L-Pages 212, which are physically stored on the in E-Pages 210. Whereas E-Pages 210 are, according to one embodiment, of a fixed size (an integer number of them may fit within an F-Page), the size of L-Pages 412, according to one embodiment, may be variable, due to variability in the compression of data to be stored. Since the compressibility of data varies, a 4 KB amount of data of one type may be compressed into a 2 KB L-Page while a 4 KB amount of data of a different type may be compressed into a 4 KB L-Page, for example. Because of this compression, according to one embodiment, the physical and logical sizes need not be aligned, as is developed further herein. L-Pages 212 and their associated L-Page numbers, therefore, may be configured to enable the controller 402 to logically reference data (such as host data, for example) stored in one or more of the E-Pages 210. The L-Page 212 may also be utilized as the basic unit of compression. Indeed, unlike F-Pages 208 and E-Pages 210, L-Pages 212 are not, according to one embodiment, fixed in size and may vary with a range defined by a minimum compressed size of, for example, about 24 bytes to a maximum uncompressed size of, for example, about 4 KB or 4 KB+.

Figure 4D:
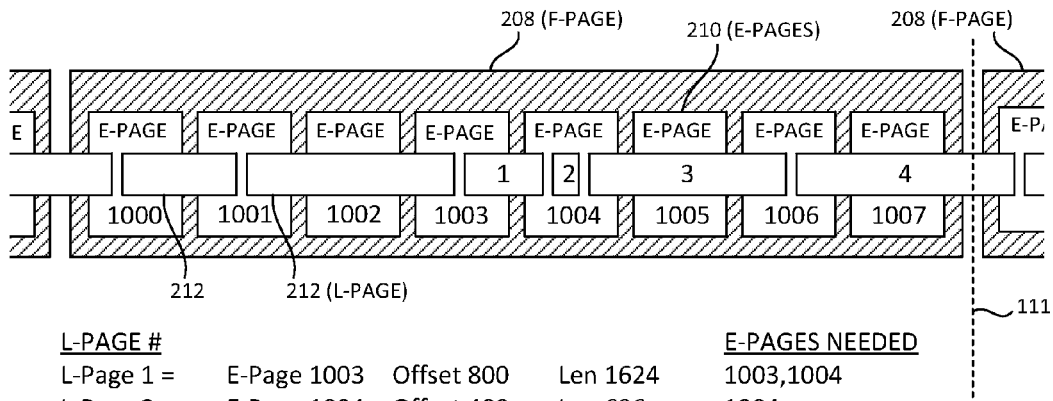
FIG. 4D shows a logical-to-physical address translation map and illustrative entries thereof according to one embodiment.
Figure 4D:
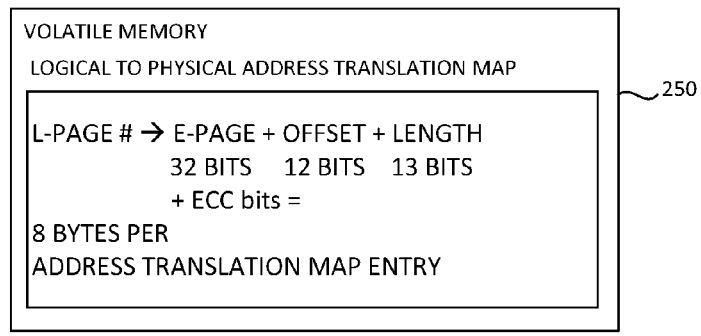

As shown in FIGS. 4A and 4D, L-Pages 212 need not be aligned with the boundaries of E-Page 210. Indeed, L-Pages 212 may be configured to have a starting address that is aligned with an F-Page 208 and/or E-Page 210 boundary, but also may be configured to be unaligned with either of the boundaries of an F-Page 208 or E-Page 210. That is, an L-Page starting address may be located at a non-zero offset from either the start or ending addresses of the F-Pages 208 or the start or ending addresses of the E-Pages 210, as shown in FIG. 4A. As the L-Pages 212 are not fixed in size and may be smaller than the fixed-size E-Pages 210, more than one L-Page 212 may fit within a single E-Page 210. Similarly, as the L-Pages 212 may be larger in size than the E-Pages 210, the L-Pages 212 may span more than one E-Page 210, and may even cross the boundaries of F-Pages 208, shown in FIG. 4A at numeral 417. As detailed further below, L-Pages 412 may also span block boundaries, as shown with respect to the block boundaries 417.

Where the LBA size is 512 or 512+ bytes, a maximum of, for example, eight sequential LBAs may be packed into a 4 KB L-Page 212, given that an uncompressed L-Page 212 may be 4 KB to 4 KB+. It is to be noted that, according to one embodiment, the exact logical size of an L-Page 212 is unimportant as, after compression, the physical size may span from few bytes at minimum size to thousands of bytes at full size. For example, for a 4 TB SSD device, 30 bits of addressing may be used to address each L-Page 212 to cover for an amount of L-Pages that could potentially be present in such a SSD.

FIG. 4D shows a logical-to-physical address translation map 250 and illustrative entries thereof, according to one embodiment. As stored data is referenced by the host in L-Pages 212 and as the SSD stores the L-Pages 212 in one or more E-Pages 210, a logical-to-physical address translation map may be required to enable the controller 430 to associate an L-Page 212 to one or more E-Pages 210. Such a logical-to-physical address translation map (effectively, an L-Page to E-Page address translation map) is shown in FIG. 2 at 250 and, in one embodiment, is a linear array having one entry per L-Page 212. Such an address translation map 250 may be stored in a volatile memory, such as a DRAM.

FIG. 4D also shows entries in the address translation map 250 for four different L-Page numbers, L-Page 1, L-Page 2, L-Page 3 and L-Page 4. According to one embodiment, each L-Page stored in the SSD may be pointed to by a single and unique L-Page number entry in the address translation map 250. Accordingly, in the example being developed herewith, four entries are shown. As shown, each entry in the map L-Page to E-Page translation 250 may comprise an L-Page number, which may comprise an identification of the E-Page containing the start address of the L-Page being referenced, the offset of the start address within the E-Page and the length of the L-Page. In addition, a plurality of ECC bits may provide error correction functionality for the map entry. For example, as shown in FIG. 4D and assuming an E-Page size of 2 KB, L-Page 4 may be referenced in the address translation map 250 as follows: E-Page 1003, offset 800, length 4,624, followed by a predetermined number of ECC bits (not shown). That is, in physical address terms, the start of L-Page 4 is within (not aligned with) E-Page 1003, and is located at an offset from the starting physical location of the E-Page 1003 that is equal to 800 bytes. The compressed L-Page 4, furthermore, extends 4,624 bytes, thereby crossing an E-Page boundary to E-Page 1004. Therefore, E-Pages 1003 and 1004 each store a portion of L-Page 4.

Similarly, the compressed L-Page 2 is stored entirely within E-Page 1004, and begins at an offset therein of 400 bytes and extends only 696 bytes within E-Page 1004, thereby remaining entirely within the starting and ending address range designated as E-Page 1004. The compressed L-Page 3 starts within E-Page 1004 at an offset of 4,120 bytes (just 24 bytes away from the boundary of L-Page 2) and extends 4,096 bytes past E-Page 1005 and into E-Page 1006. Therefore, L-Page 3 spans a portion of E-Page 1004, all of E-Page 1005 and a portion of E-Page 1006. Finally, L-Page 4 begins within E-Page 1006 at an offset of 4,144 bytes, and extends 3,128 bytes to fully span E-Page 1007, to cross an F-Page boundary into E-Page 1008 of the next F-Page.

Collectively, each of these constituent identifier fields (E-Page, offset, length and ECC) making up each entry of the address translation map 250 may be, for example, 8 bytes in size. That is, for an exemplary 4 TB drive, the address of the E-Page may be 32 bits in size, the offset may be 42 bits (for E-Page data portions up to 4 KB) in size, the length may be 43 bits and the ECC field may be provided. Such an 8 byte entry may be created each time an L-Page is written or modified, to enable the controller 430 to keep track of the data (written in L-Pages) within the flash storage. As illustrated above, this 8-byte entry in the address translation map 250 may be termed a logical page number or LPN. It is to be noted that, in the case of a 4 KB sector size, the LBA is the same as the LPN. The LPN, therefore, may constitute the index of the L-Page within the logical-to-physical address translation table 250 and comprise the address of the entry within the non-volatile memory. Therefore, when the controller 430 receives a read command from the host 410, the LPN may be derived from the supplied LBA and used to index into the address translation map 250 to extract the location of the data to be read in the flash memory. When the controller 402 receives a write command from the host 418, the LPN may be constructed from the LBA and the address translation map 250 may be modified. For example, a new entry therein may be created. Depending upon the size of the volatile memory storing the address translation map 250, the LPN may be stored in a single entry or broken into, for example, two entries. For example, a first entry may identify the E-Page containing the starting address of the L-Page in question (plus ECC bits) and a second entry may identify the offset and length (plus ECC bits). Together, these two entries may correspond and point to a single L-Page within the flash memory. In other embodiments, the specific format of the address translation map entries may be different from the examples shown above.

As illustrated by L-Pages 1, 3 and 4, a single read operation may span a plurality of E-Pages, or other code words, wherein error correction of each of the E-Pages may either pass or fail after a first read. In a situation where a read of, for example, L-Page 3 results in a failed E-Page. For example, one of the three E-Pages associated with L-Page 3 may fail, while the remaining two E-Pages associated with L-Page 3 pass. In certain embodiments, passing E-pages may provide bit-flip count information which may be used to generate reliability information when decoding associated failed E-page(s). Passing reference E-Pages may be part of the same F-Page as the relevant failed E-page(s). Alternatively, passing reference E-Pages may be part of a separate F-Page, such as a neighboring F-Page, or other F-Page having similar error characteristics to the F-Page containing the relevant failed E-page (s).

Figure 5:
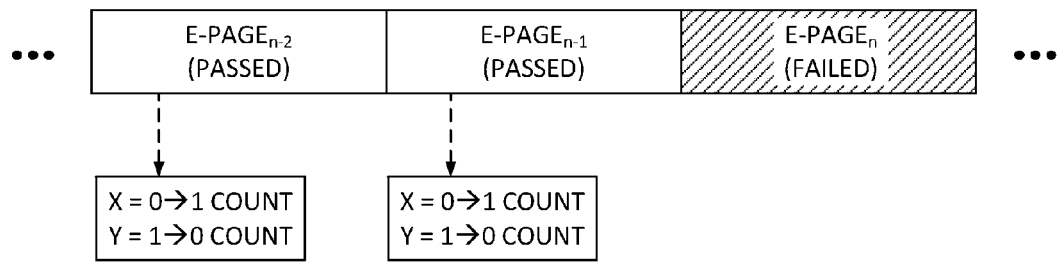
FIG. 5 is a diagram showing a plurality of code words in a solid-state memory array according to one embodiment.

FIG. 5 illustrates a sequence of code words, or E-Pages, associated with a single L-Page that is subject to a hard decode. As shown, a first E-Page (E-Page$_n$) may fail error correction based on one-read hard decoding, whereas one or more additional E-Pages (E-Page$_{n-1}$, E-Page$_{n-2}$) may pass error correction. When decoding of an E-Page passes, the associated quality metric may be returned by the decoder, which may indicate how far from the ideal location the relevant voltage read level is. The quality metric may therefore indicate which side of the reference voltage is more reliable than the other, at least with respect to the passing code word (s). In certain embodiments, passing pages return data associated with flipped-bit counts, such as total 0-to-1 flipped-bit count and 1-to-0 flipped-bit count, which may be referred to for discussion purposes as X and Y, respectively.

Because of the physical proximity between the illustrated E-Pages, as well as other factors, the endurance and/or data retention condition of the failed page may be similar to that of certain passing pages. Furthermore, as each of the illustrated pages is read using the same reference voltage level, the flipped-bit count data associated with the passing pages may at least partially represent a possible flipped-bit count condition of the failed E-Page. Therefore, the flipped-bit count information associated with the passing pages may be utilized to provide reliability information for the failed E-Page. In certain embodiments, reference passing E-Pages are selected based on a determination that such pages have certain error characteristics as the failed E-Page.

Certain solid-state decoding methods rely only on the information from each code word, or E-Page, to correct the same code word. Therefore, when a code word correction fails, the only solution may be to obtain more information about the failed code word by reading the memory with a different reference voltage. Then the new information obtained through additional reads may be used to update data reliability information and perform either another hard decoding or a form of soft decoding to recover the data. However, in solid-state drives, reading data from the memory array can be the most time-consuming, or one of the most time-consuming, processes among the relevant error management operations. Therefore, avoidance of multiple reads may be desirable.

Because data from a single F-page page may generally be read with the same reference voltage, the information from other successfully decoded code words on the same page (or block) can be used to update the reliability information of uncorrectable code words, particularly in cases where errors are at least in part to read voltage offset. Such posteriori reliability information can result in successful decoding of the previously-failed code word, thereby preventing the need for additional reads.

Figure 6:
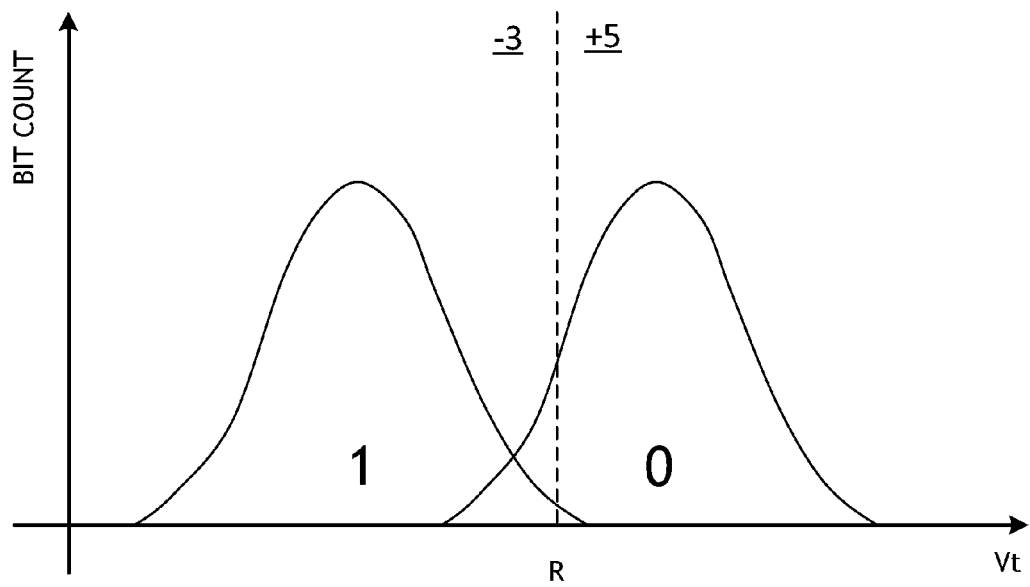
FIG. 6 illustrates a probability distribution for memory cells in a solid-state memory device according to an embodiment.

FIG. 6 illustrates an example two-state voltage distribution which may be interpreted by a decoder using modified reliability information. For example, flipped-bit count information from passing pages may indicate that the returned '0' values resulting from a memory read at the reference level R are more reliable than returned '1' values. For example, the 0-to-1 bit count of passing pages may be determined to be greater than the 1-to-0 bit count, thereby indicating that the read level R is disposed too far towards the '0' distribution. Such reliability determination is visually indicated in FIG. 6 by the amount of overlap of the '0' distribution with the reference level R compared to the amount of overlap of the '1' distribution. Based on the reliability information, the multi-bit decoder input may be modified such that a value associated with returned 0's increased (e.g., absolute value) or otherwise modified to indicate increased reliability, whereas a value associated with returned 1's is decreased (e.g., absolute value) or otherwise modified to indicate less reliability. Although the distribution of FIG. 6 shows reliability information as comprising values of −3 and +5, any desirable representations or values for reliability information may be utilized.

In certain embodiments, predefined binary reliability values are selected (e.g., −3/+5 and +3/−5), wherein one of the binary sets of values is used depending on whether the number of 0-to-1 bit flips or 1-to-0 bit flips is greater. In certain embodiments, the degree of bias, determined based on the difference between the number of 1-to-0 bit flips and 0-to-1 bit flips, is used to define the reliability data attached to the respective read return values. For example, the reliability values may be determined as a function of the portion of the 1-to-0 bit flips, or 0-to-1 bit flips, relative to the total number of bit flips. In certain embodiments, the log of such portion is used to calculate the reliability values. In certain embodiments, ranges of bias values are used in connection with a hash table, or the like, to select discrete sets of reliability values.

In certain embodiments, data from successful decodes is not necessarily used in generating soft-decision reliability values. One of a predetermined set of reliability values (e.g., −3/+5, −5/+3) may be used irrespective of bias determined based on passing pages. If such selection does not result in a successful decode, or results in a gain or improvement that is less than an expected threshold or amount, another of the set of reliability values may be used, or another soft-decision input generation method may be used.

Figure 7:
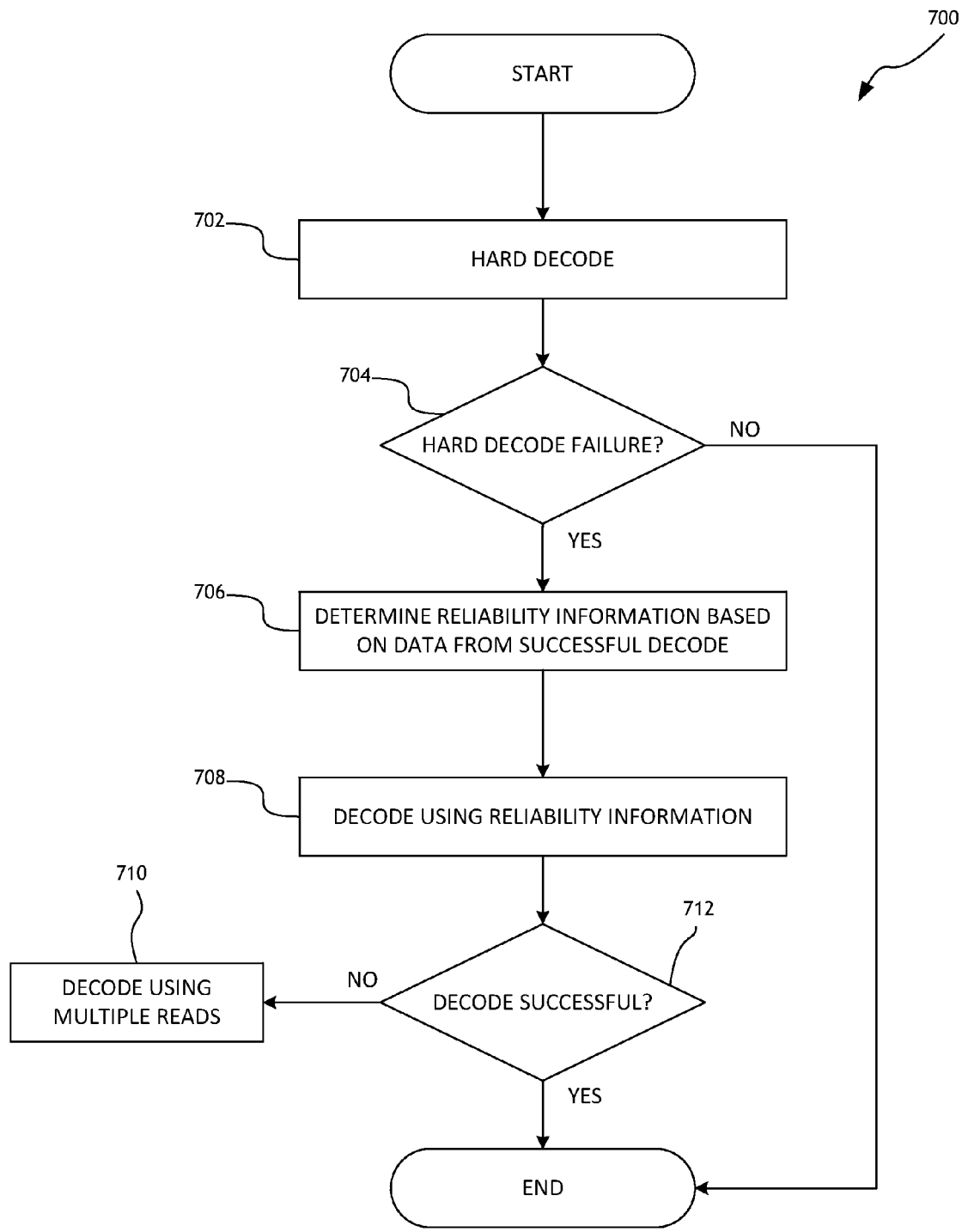
FIG. 7 provides a flow diagram for a process for decoding memory cells in a solid-state memory device according to an embodiment.

FIG. 7 is a flow diagram illustrating a process 700 for single-read decoding according to one or more embodiments disclosed herein. In one embodiment, the process 700 is performed at least partially by the controller 130, error management module 134 and/or decoder 136 described above in connection with FIG. 1. The process 700 involves performing a hard decode of a page of a solid-state memory array at block 702. The process 700 involves detecting a hard decode failure at block 704. When a hard decode fails with respect to one or more code words of the page, the process 700 includes determining reliability information associated with the page at block 706. Such a determination may be based at least in part on data from one or more successfully decoded code words of the page, or from another page having similar data retention characteristics as the present page. In certain embodiments, the failed code word(s) are then decoded using soft-decision input incorporating the reliability information at block 708. If the decoding is unsuccessful, the process 700 may involve using multiple reads to produce soft-decision input for decoding, as shown at block 710. Alternatively, unsuccessful decoding may prompt a modification of the reliability information based on one or more successfully-decoded code word, or based on other information, followed by retrying the one-read decode.

Figure 8:
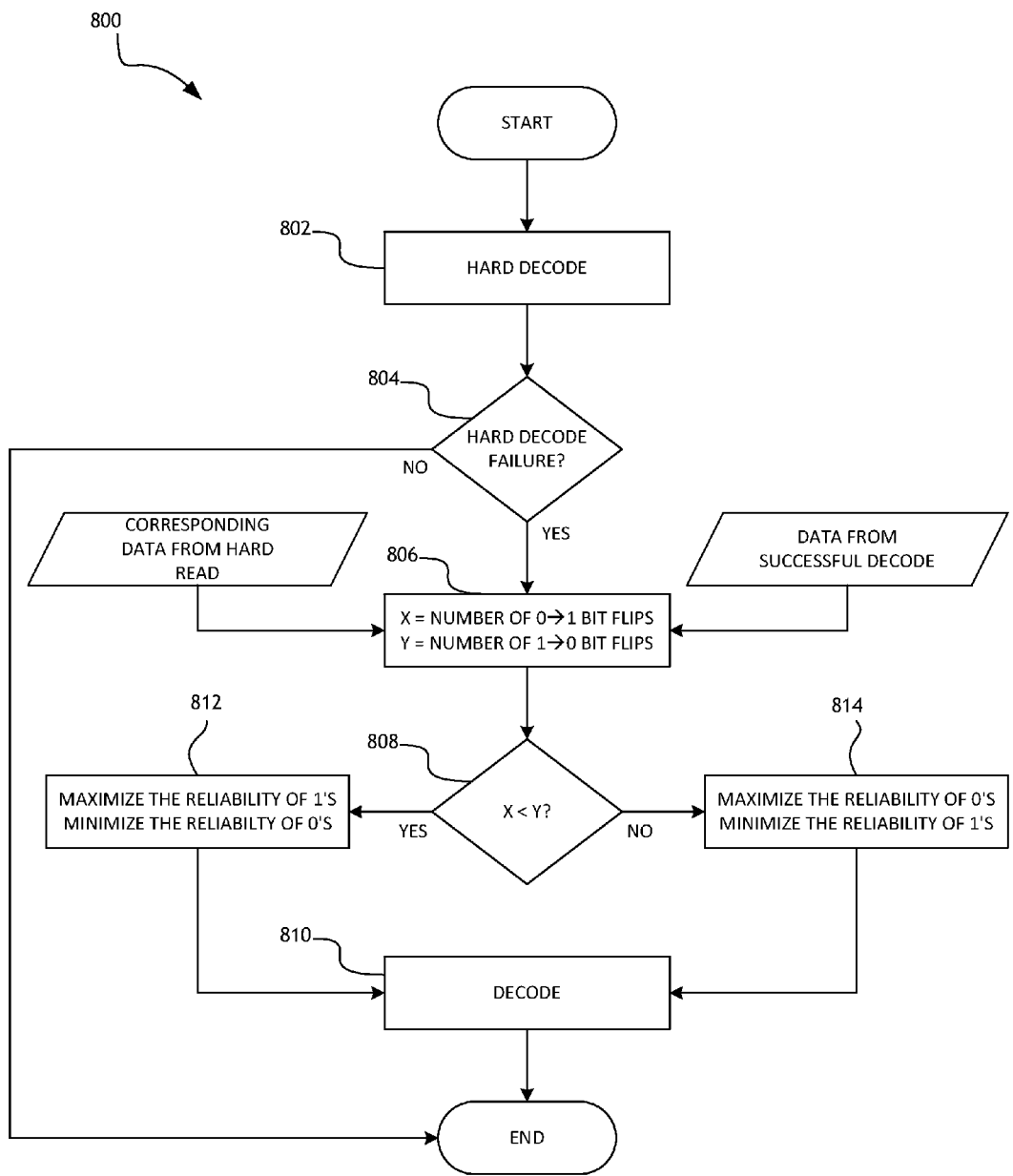
FIG. 8 provides a flow diagram for a process for decoding memory cells in a solid-state memory device according to an embodiment.

FIG. 8 is a flow diagram illustrating a process 800 for single-read decoding according to one or more embodiments disclosed herein. In one embodiment, the process 800 is performed at least partially by the controller 130, error management module 134 and/or decoder 136 described above in connection with FIG. 1. The process 800 may involve performing a hard decode of a page in a solid-state memory array at block 802. As shown, after a decode failure is detected at block 804, data from other successful decoded code words may be compared against their respective pre-decoding hard-read values to determine the number of bits that had to be corrected by flipping 0's to 1's and 1's to 0's. By determining the number of 1-to-0 and 0-to-1 flips (806), decoder (e.g., LDPC) reliability information associated in the 1's and 0's may be modified accordingly to maximize the reliability values of bits with higher probability of flips, and minimize the reliability values of the bits with smaller probability of flips. The adjusted posteriori reliability values may then be used to perform another decoding on the previously failed code word(s).

The process 800 may involve providing the posteriori distributions and probabilities to the decoder at block 810, which in turn uses the information to modify log-likelihood ratio (LLR) values. This may result in reduced entropy in the read signal, which may can make decoding more effective. That is, the channel capacity may be increased to conditional channel capacity by providing channel state information (CSI). The decoder may therefore perform as previously, but with new posteriori LLRs. In certain embodiments, these LLR values are predetermined values (e.g., in a look-up table) and do not need to be calculated in real time. Furthermore, based on symmetry information (i.e., the difference or ratio between 1-to-0 and 0-to-1 bit flip counts), one set of LLRs may be selected. In certain embodiments, such a process does not affect the power and/or area factors of the memory considerably, though the need for additional reads may be reduced.

Improved Performance

Data throughput and latency can represent significant performance metrics for solid-state drives. Extra reads to attempt re-decoding of originally uncorrectable data can substantially reduce performance and increase power consumption due to the amount of time required for solid-state reads. Furthermore, it may be desirable for an error correction strategy to postpone the usage of lower code rates as much as possible to prevent write amplification/over provisioning, which can reduce the effective memory life. Solutions disclosed herein may provide for increased correction capability with a minimum number of additional reads from flash, which can represent a substantial factor in solid-state memory throughput. While high code rates can help reduce actual write amplification, they may provide relatively weaker correction capability. Therefore, they may need to switch to soft decoding sooner, which in turn may require extra memory (e.g., flash) reads.

Certain one-read soft-decision embodiments disclosed herein, by using available apriori information, may help the decoder (e.g., LDPC) to use single-read decoding of the otherwise uncorrectable code words. The apriori information from the channel may be used to generate more informed reliability values, leading to higher probabilities of successful decoding without extra memory reads. Therefore, such solutions, by reducing the total number of additional reads, may allow for sustaining high throughput with higher memory wear at the same code rate. In certain embodiments, approximately 30% to 50% of failed code words can be recovered using a single read. This may considerably improve the overall performance of the drive and/or postpone throughput performance degradation when the memory ages.

Figure 9:
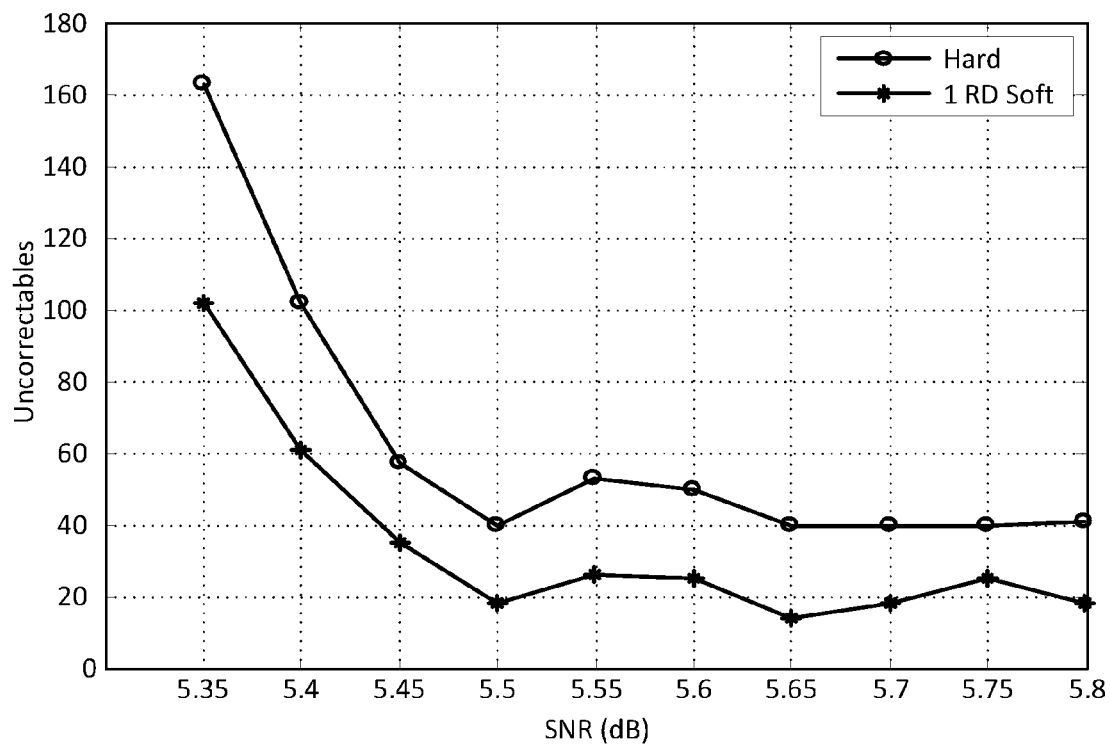
FIG. 9 is a graph illustrating potential decrease in uncorrectable data for one-read soft decoding according to an embodiment.
Figure 10:
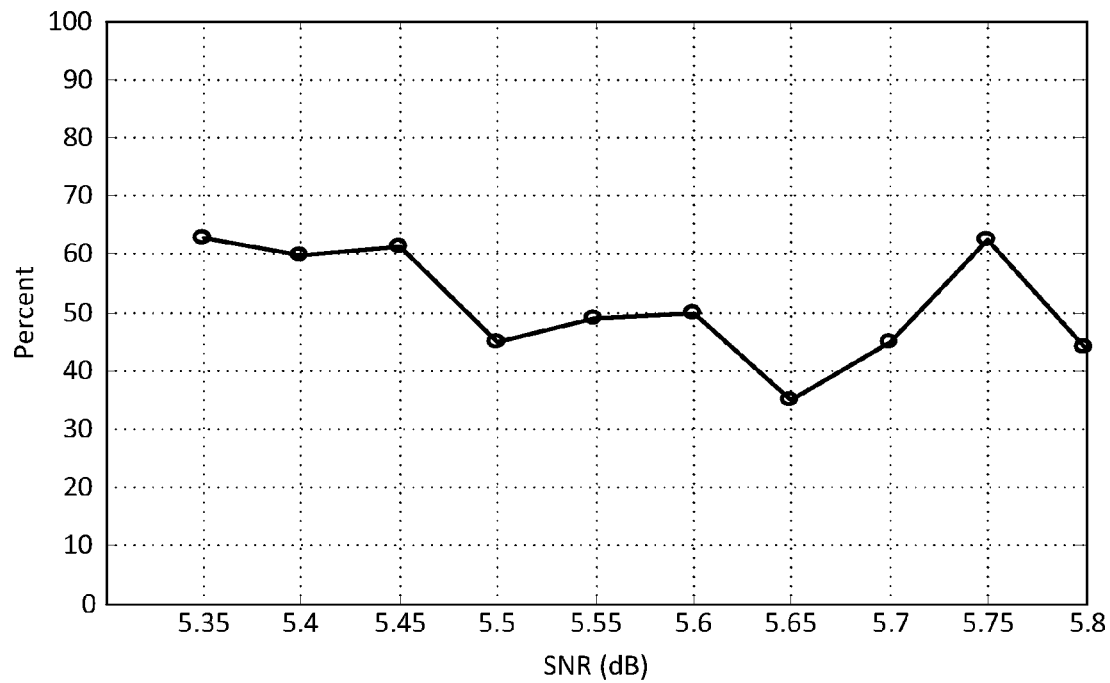
FIG. 10 is a graph illustrating the probability of a second read being necessary after hard decoding failure according to an embodiment.

FIGS. 9 and 10 illustrate possible performance of error correction in certain embodiments. The graph of FIG. 9 demonstrates the number of uncorrectable code words with hard and one read soft, with the first read offset to a degree according to an embodiment. As shown in FIG. 9, the number of uncorrectable code words may be reduced using one-read soft decoding, as described herein. FIG. 10 illustrates the percentage of time a second read may be necessary or desirable after a hard failure, with the first read offset to a degree.

Additional Embodiments

Those skilled in the art will appreciate that in some embodiments, other types of data storage systems and/or programming schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
   a non-volatile memory array including a plurality of non-volatile solid-state memory elements configured to store a plurality of code words; and
   a controller configured to:
   perform a first decoding of a first code word based at least in part on data associated with a reading of the first code word;
   detect a decoding failure associated with the first decoding;
   determine bit flip count data associated with a successful decoding of a second code word stored on a same page in the non-volatile memory array as the first code word;
   determine reliability information for decoding the first code word in response to the decoding failure, the determining based at least in part on the bit flip count data associated with the successful decoding of the second code word; and
   perform a second decoding of the first code word based at least in part on the reliability information.

2. The data storage device of claim 1, wherein the controller is further configured to determine the reliability information for decoding the first code word without performing an additional read of the first code word.

3. The data storage device of claim 1, wherein the first decoding is a hard decoding.

4. The data storage device of claim 1, wherein the controller is further configured to determine the bit flip count data associated with the successful decoding of the second code word based on a comparison of successfully decoded data and pre-decoding data.

5. The data storage device of claim 1, wherein:
   the bit flip count data comprises a 0-to-1 bit flip count and a 1-to-0 bit flip count, and
   the controller is further configured to determine the reliability information by maximizing a reliability value associated with read 0's and minimizing a reliability value associated with read 1's when the 0-to-1 bit flip count is greater than the 1-to-0 bit flip count.

6. The data storage device of claim 1, wherein:
   the bit flip count data comprises a 0-to-1 bit flip count and a 1-to-0 bit flip count, and
   the controller is further configured to determine the reliability information by maximizing a reliability value associated with read 1's and minimizing a reliability value associated with read 0's when the 1-to-0 bit flip count is greater than the 0-to-1 bit flip count.

7. The data storage device of claim 1, wherein the controller is further configured to determine the reliability information by consulting a hash table associating reliability values with the bit flip count data.

8. The data storage device of claim 1, wherein the controller is further configured to determine the reliability information by associating pre-assigned reliability information with the first code word.

9. The data storage device of claim 1, wherein the controller is further configured to determine updated reliability information when the second decoding fails.

10. The data storage device of claim 1, wherein the controller is further configured to generate updated reliability information based on one or more additional reads when the second decoding fails.

11. The data storage device of claim 1, wherein the reliability information comprises log likelihood ratio (LLR) data, and wherein the controller is further configured to perform the second decoding at least in part by providing the LLR data to a low-density parity-check code (LDPC) decoder.

12. A method of decoding data in a data storage system, the method comprising:
   performing a first decoding of a first code word based at least in part on data associated with a reading of the first code word;
   detecting a decoding failure associated with the first decoding;
   determining bit flip count data associated with a successful decoding of a second code word stored on a same page in the non-volatile memory array as the first code word;
   determining reliability information for decoding the first code word in response to the decoding failure, said determining based at least in part on the bit flip count data associated with a successful decoding of the second code word; and
   performing a second decoding of the first code word based at least in part on the reliability information.

13. The method of claim 12, wherein said determining the reliability information for decoding the first code word is performed without performing an additional read of the first code word.

14. The method of claim 12, wherein the first decoding is a hard decoding.

15. The method of claim 12, wherein said determining the bit flip count data associated with the successful decoding of the second code word is based on a comparison of successfully decoded data and pre-decoding data.

16. The method of claim 12, wherein:
   the bit flip count data comprises a 0-to-1 bit flip count and a 1-to-0 bit flip count, and
   said determining the reliability information comprises maximizing a reliability value associated with read 0's and minimizing a reliability value associated with read 1's when the 0-to-1 bit flip count is greater than the 1-to-0 bit flip count.

17. The method of claim 12, wherein:
   the bit flip count data comprises a 0-to-1 bit flip count and a 1-to-0 bit flip count, and
   said determining the reliability information comprises maximizing a reliability value associated with read 1's and minimizing a reliability value associated with read 0's when the 1-to-0 bit flip count is greater than the 0-to-1 bit flip count.

18. The method of claim 12, wherein said determining the reliability information comprises consulting a hash table associating reliability values with the bit flip count data.

19. The method of claim 12, wherein said determining the reliability information comprises associating pre-assigned reliability information with the first code word.

20. The method of claim 12, further comprising determining updated reliability information when the second decoding fails.

21. The method of claim 12, further comprising generating updated reliability information based on one or more additional reads when the second decoding fails.

22. The method of claim 12, wherein the reliability information comprises log likelihood ratio (LLR) data, and wherein performing the second decoding comprises providing the LLR data to a low-density parity-check code (LDPC) decoder.

* * * * *